United States Patent
Matsumoto et al.

(10) Patent No.: US 12,389,580 B2
(45) Date of Patent: Aug. 12, 2025

(54) STORAGE

(71) Applicant: FUJI CORPORATION, Chiryu (JP)

(72) Inventors: Masanari Matsumoto, Chiryu (JP); Katsuaki Tanaka, Miyoshi (JP); Hideaki Oki, Anjo (JP); Masanori Kawaguchi, Kariya (JP)

(73) Assignee: FUJI CORPORATION, Chiryu (JP)

( * ) Notice: Subject to any disclaimer, the term of this patent is extended or adjusted under 35 U.S.C. 154(b) by 818 days.

(21) Appl. No.: 17/761,693

(22) PCT Filed: Sep. 20, 2019

(86) PCT No.: PCT/JP2019/037123
§ 371 (c)(1),
(2) Date: Mar. 18, 2022

(87) PCT Pub. No.: WO2021/053833
PCT Pub. Date: Mar. 25, 2021

(65) Prior Publication Data
US 2022/0346294 A1 Oct. 27, 2022

(51) Int. Cl.
*B65G 1/08* (2006.01)
*H05K 13/08* (2006.01)

(52) U.S. Cl.
CPC ............. *H05K 13/086* (2018.08); *B65G 1/08* (2013.01); *B65G 2203/0216* (2013.01)

(58) Field of Classification Search
CPC . H05K 13/086; B65G 1/08; B65G 2203/0216
See application file for complete search history.

(56) References Cited

U.S. PATENT DOCUMENTS

| | | | |
|---|---|---|---|
| 2011/0072654 A1* | 3/2011 | Oyama | H05K 13/0417 29/832 |
| 2012/0093620 A1 | 4/2012 | Murata et al. | |

(Continued)

FOREIGN PATENT DOCUMENTS

| | | |
|---|---|---|
| JP | 61-44404 U | 3/1986 |
| JP | 8-127403 A | 5/1996 |

(Continued)

OTHER PUBLICATIONS

International Search Report mailed on Dec. 17, 2019 in PCT/JP2019/037123 filed on Sep. 20, 2019 (1 page).

*Primary Examiner* — Gary Collins
(74) *Attorney, Agent, or Firm* — Oblon, McClelland, Maier & Neustadt, L.L.P.

(57) ABSTRACT

A storage includes a first opening section, a second opening section, and a moving section. An article used in a board working machine configured to perform predetermined board work on a board is received or delivered through the first opening section. The second opening section is an opening section different from the first opening section, and when reception work or delivery work of the article is performed through the first opening section, an article different from the article can be received or delivered through the second opening section. The moving section moves the article to a predetermined storage section when the article is received through the first opening section or the second opening section and moves the article stored in the storage section to the first opening section or the second opening section when the article is delivered.

7 Claims, 6 Drawing Sheets

(56) References Cited

U.S. PATENT DOCUMENTS

| | | | | |
|---|---|---|---|---|
| 2016/0205819 A1* | 7/2016 | Jacobsson | .......... | H05K 13/0417 |
| | | | | 700/112 |
| 2018/0277153 A1* | 9/2018 | Toritani | ................ | G06F 3/0604 |
| 2022/0055834 A1* | 2/2022 | Mietusch | ............... | B65G 1/045 |

FOREIGN PATENT DOCUMENTS

| | | |
|---|---|---|
| JP | 2011-6222 A | 1/2011 |
| WO | WO 2019/142336 A1 | 7/2019 |

\* cited by examiner

STORAGE

TECHNICAL FIELD

The present specification discloses techniques related to a storage.

BACKGROUND ART

In a manual baggage unloading device in an automatic warehouse described in Patent Literature 1, a manual unloading port is provided on a storage shelf. The manual baggage unloading device unloads a baggage toward a side opposite to a traveling path of a stacker crane through the manual unloading port. A chute is provided at the manual unloading port. A baggage manually extracted from the storage shelf is guided obliquely downward in a slidable manner by the chute.

An automatic warehouse facility described in Patent Literature 2 includes a picking cart. The picking cart includes a lifter and a chute. The chute is attached to the lifter, and a lower tip of the chute is provided toward a conveying conveyor.

PATENT LITERATURE

Patent Literature 1: JP-A-H8-127403
Patent Literature 2: JP-UM-A-S61-44404

SUMMARY OF THE INVENTION

Brief Summary of the Invention

Technical Problem

When an article is received in or delivered from a storage through one opening section, other articles cannot be received in or delivered from the storage until the reception or delivery of the article is completed. Therefore, there is a possibility that work efficiency of reception work or delivery work of the article in the storage is reduced.

In view of such a circumstance, the present specification describes a storage capable of improving the work efficiency of the reception work or delivery work of articles.

Solution to Problem

The present specification discloses a storage including a first opening section, a second opening section, and a moving section. An article used in a board working machine configured to perform predetermined board work on a board is received or delivered through the first opening section. The second opening section is an opening section different from the first opening section, and when reception work or delivery work of the article is performed through the first opening section, an article different from the article can be received or delivered through the second opening section. The moving section moves the article to a predetermined storage section when the article is received through the first opening section or the second opening section and moves the article stored in the storage section to the first opening section or the second opening section when the article is delivered.

Advantageous Effects Effect of the Invention

According to the above storage, the storage includes a first opening section, a second opening section, and a moving section. As a result, the storage can perform reception work or delivery work of an article through the first opening section and reception work or delivery work of an article different from the article through the second opening section in parallel with each other, and thus, work efficiency of the reception work or the delivery work of the article is improved.

DESCRIPTION OF EMBODIMENTS

1. Embodiment

Figure 1:
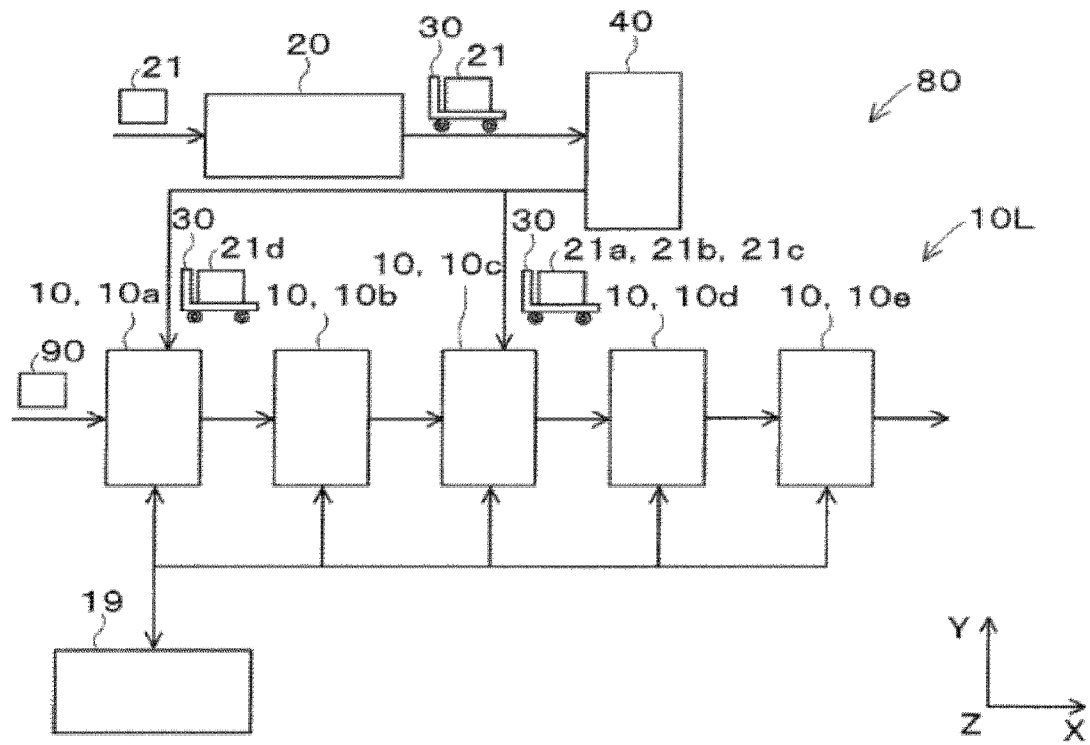
FIG. 1 is a configuration diagram illustrating a configuration example of a board production facility.

As illustrated in FIG. 1, storage 40 of the present embodiment is provided in board production facility 80. board production facility 80 includes board working line 10L, arrival section 20, unmanned conveyance vehicle 30, and storage 40. Article 21 which has arrived at arrival section 20 is conveyed to storage 40 by unmanned conveyance vehicle 30. Article 21 stored in storage 40 is conveyed to board working line 10L by unmanned conveyance vehicle 30.

1-1. Board Working Line 10L

In board working line 10L, predetermined board work is performed on board 90. The type and number of board working machines 10 constituting board working line 10L are not limited. As illustrated in FIG. 1, board working line 10L of the present embodiment includes multiple (five) board working machines 10 including printing machine 10a, printing inspection machine 10b, component mounter 10c, reflow furnace 10d, and appearance inspector 10e, and board 90 is conveyed in this order by a board conveyance device.

Figure 2:
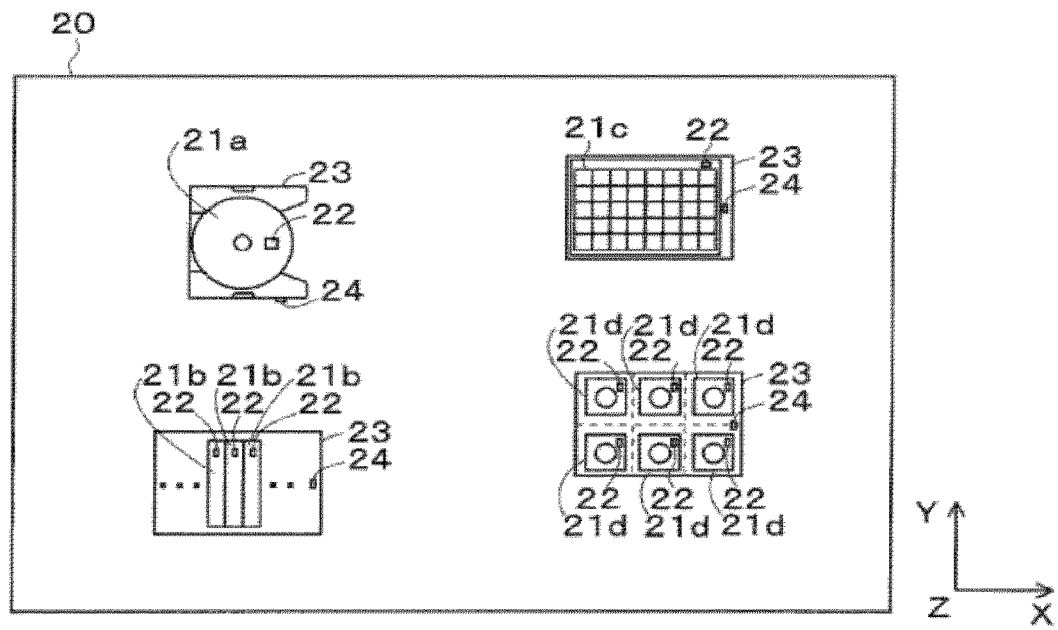
FIG. 2 is a plan view illustrating an example of a state in which an article is accommodated in an accommodation case in an arrival section.

Printing machine 10a prints solder at mounting positions of multiple components of board 90. The solder printed on board 90 has a predetermined viscosity, and the solder functions as a bonding material for bonding board 90 and the component mounted on board 90. As illustrated in FIG. 2, solder container 21d accommodates solder. As solder container 21d, for example, a bottomed tubular or tubular sealable container can be used.

Printing inspection machine 10b inspects a print state of the solder printed by printing machine 10a. Component mounter 10c mounts the multiple components to board 90 on which the solder is printed. Component mounter 10c may be one or multiple component mounters. In a case where multiple component mounters 10c are provided, multiple component mounter 10c can be shared to mount the multiple components on board 90.

Component mounter 10c includes a component supplying device for supplying a component to be mounted on board 90. For example, the component supplying device can supply components using feeder 21b including reel 21a, tray 21c, or the like, as illustrated in FIG. 2. A component tape (carrier tape) for accommodating components is wound around reel 21a. Reel 21a is rotatably and detachably provided on feeder 21b. A distal end portion of the component tape is drawn to a component take-out section provided on feeder 21b, and thus, the components are sequentially supplied.

For example, reel 21a can supply a relatively compact component such as a chip component. Components are arranged in tray 21c. For example, tray 21c can supply relatively large components such as a Quad Flat Package (QFP) and a Ball Grid Array (BGA). Reflow furnace 10d heats board 90 to which the multiple components are mounted by component mounter 10c, melts the solder, and performs soldering. Appearance inspector 10e inspects the mounting states or the like of the multiple components mounted by component mounter 10c.

In this manner, board working line 10L can use multiple (five) board working machines 10 to sequentially convey board 90 and execute production process including inspection process to produce a board product. It should be noted that board working line 10L may include, as required, board working machine 10 such as, for example, a function inspector, a buffer device, a board supplying device, a board flipping device, a shield mounting device, an adhesive application device, and an ultraviolet ray irradiation device.

Multiple (five) board working machines 10 and management device 19 constituting board working line 10L are provided so as to be capable of communicating with each other by a wired or wireless communication section. Management device 19 controls multiple (five) board working machines 10 constituting board working line 10L, and monitors an operation situation of board working line 10L. Management device 19 stores various control data for controlling multiple (five) board working machines 10. Management device 19 transmits control data to each of multiple (five) board working machines 10. In addition, each of multiple (five) board working machines 10 transmits an operation situation and a production situation to management device 19.

1-2. Arrival Section 20 and Unmanned Conveyance Vehicle 30

When article 21 arrives at arrival section 20, a predetermined landing work is performed. Then, article 21 is accommodated in accommodation case 23, mounted on unmanned conveyance vehicle 30, and conveyed to storage 40. After article 21 is stored in storage 40, article 21 is supplied to board working line 10L as required.

As described above, board working line 10L includes printing machine 10a that prints solder at the mounting positions of multiple components of board 90. In this case, for example, solder container 21d accommodating the solder corresponds to article 21. In addition, board working line 10L includes component mounter 10c for mounting components on board 90. In this case, reel 21a around which a component tape accommodating the component is wound corresponds to article 21.

Moreover, feeder 21b on which reel 21a is rotatably and detachably provided corresponds to article 21. Further, tray 21c on which the components are arranged corresponds to article 21. A holding member for holding the component corresponds to article 21. For example, the holding member includes a suction nozzle, a chuck, or the like. In addition, a holding member accommodating device (for example, a nozzle station) that accommodates the holding member corresponds to article 21.

Article 21 is provided with identification code 22. Identification code 22 stores identification information for identifying article 21. As identification code 22, for example, a one-dimensional code, a two-dimensional code, a wireless tag, or the like can be used. When article 21 arrives at arrival section 20, for example, an operator of arrival section 20 issues identification information using an article management device. In addition, the operator reads a barcode or the like provided on article 21 by a supplier (vendor) using a barcode reader or the like. Then, the operator can acquire article information of article 21 from a database in which article information related to article 21 is registered. The operator stores at least the identification information among the identification information and the article information in identification code 22 using the article management device.

The operator of arrival section 20 attaches at least identification code 22 in which the identification information is stored to article 21, and accommodates article 21 in accommodation case 23. Accommodation case 23 may have any form as long as accommodation case 23 can accommodate at least one article 21. Specific code 24 is provided in accommodation case 23. Specific code 24 stores specific information for specifying accommodation case 23. As specific code 24, for example, a one-dimensional code, a two-dimensional code, a wireless tag, or the like can be used.

When article 21 is accommodated in accommodation case 23, the operator reads specific code 24 using a reader, and reads identification code 22 provided on article 21 using the reader. As a result, a correspondence between the specific information specifying accommodation case 23 accommodating article 21 and the identification information identifying article 21 is generated, and the correspondence is transmitted to and stored in a storage section of management device 19.

FIG. 2 illustrates an example of a state in which reel 21a, which is article 21, is accommodated in accommodation case 23. In addition, FIG. 2 illustrates an example of a state in which feeder 21b, which is article 21, is accommodated in accommodation case 23. Further, FIG. 2 illustrates an example of a state in which tray 21c, which is article 21, is accommodated (stacked) in accommodation case 23. Tray 21c is stored in a packaging bag, and identification code 22 is attached to a packaging bag of tray 21c. In addition, FIG. 2 illustrates an example of a state in which solder container 21d, which is article 21, is accommodated in accommodation case 23. It should be noted that FIG. 2 is a plan view schematically illustrating an example of the accommodation state of article 21. In the present specification, a case where article 21 is reel 21a is mainly described as an example, but the same can be said for other articles 21.

The operator of arrival section 20 mounts accommodation case 23 in which article 21 is accommodated on unmanned conveyance vehicle 30. Unmanned conveyance vehicle 30 is an automatic guided vehicle (AGV) without requiring driving operation by the operator. Unmanned conveyance vehicle 30 is not limited to the automatic guided vehicle as long as unmanned conveyance vehicle 30 can convey article 21 by self-driving. board working line 10L, arrival section 20, unmanned conveyance vehicle 30, and storage 40 are provided so as to be capable of communicating with each other by a wired or wireless communication section. When article 21 is mounted on unmanned conveyance vehicle 30, management device 19 transmits a conveyance command to unmanned conveyance vehicle 30. The conveyance command includes a conveyance destination of article 21. Management device 19 selects storage 40 in which article 21 can be stored and determines the conveyance destination. When unmanned conveyance vehicle 30 receives the conveyance command, unmanned conveyance vehicle 30 conveys article 21 to storage 40 designated as the conveyance destination.

It should be noted that unmanned conveyance vehicle 30 can convey article 21 without using accommodation case 23. In addition, the operator can convey article 21 without using unmanned conveyance vehicle 30. Further, at least a portion of the work performed by the operator described above can be automated using a conveyance device (for example, belt conveyor or the like), an actuator (for example, a robot arm or the like), an article management device, or the like.

1-3. Storage 40

Figure 3A:
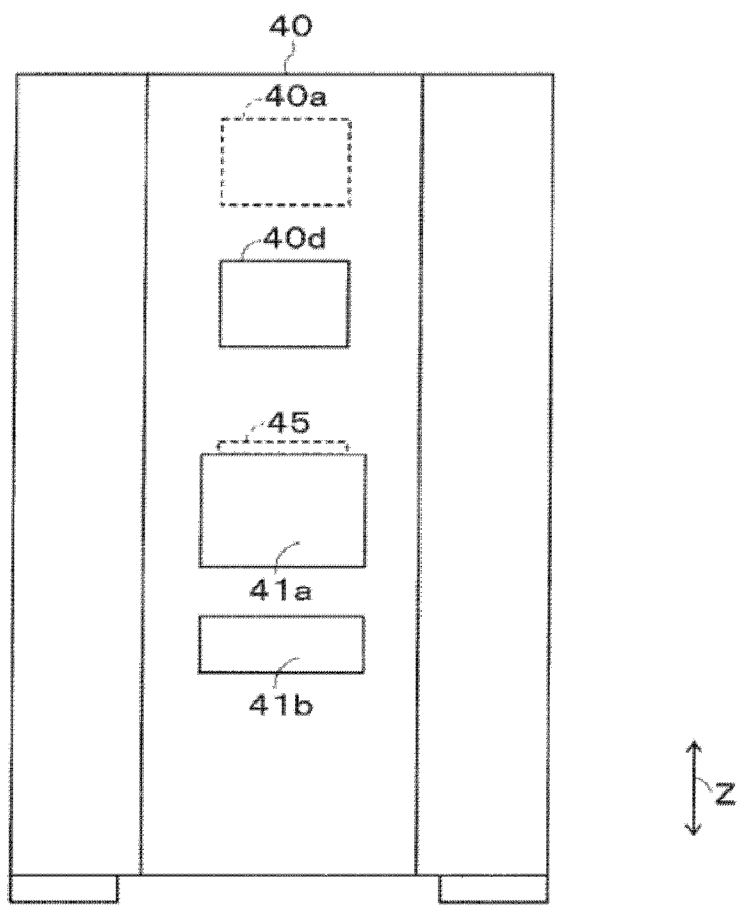
FIG. 3A is a front view illustrating an example of a storage.
Figure 3B:
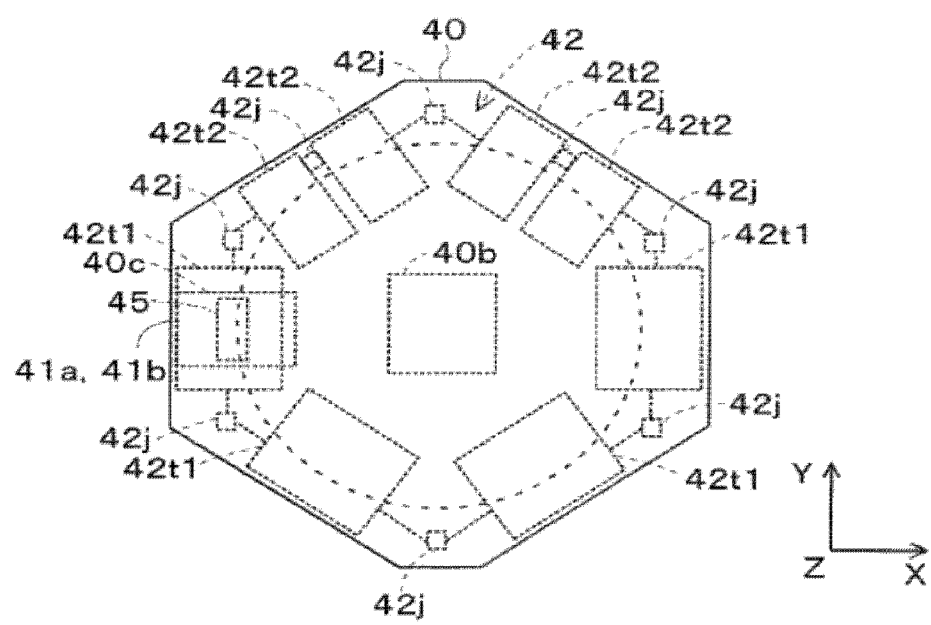
FIG. 3B is a plan view of the storage of FIG. 3A.
Figure 3C:
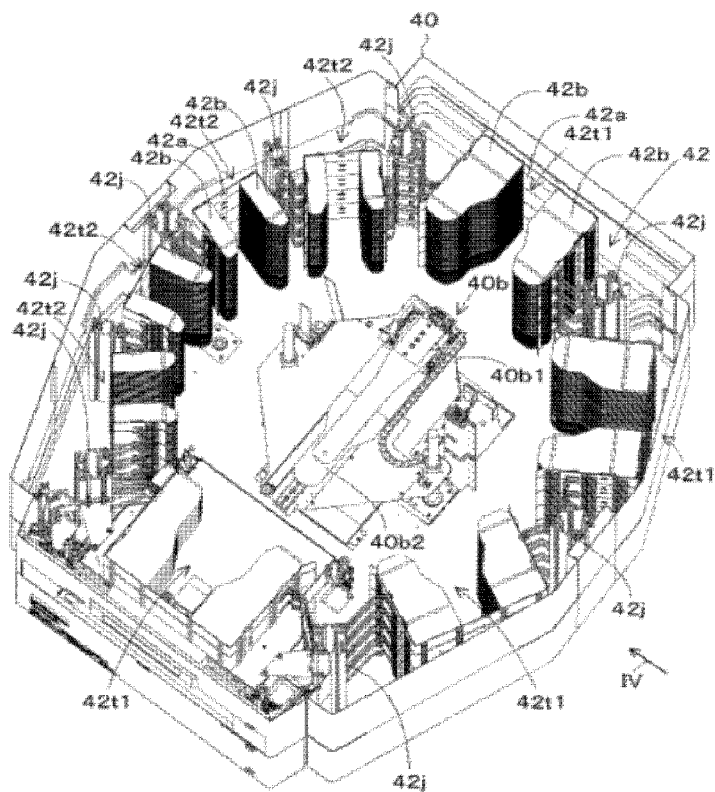
FIG. 3C is a perspective view of the storage of FIG. 3A.
Figure 4:
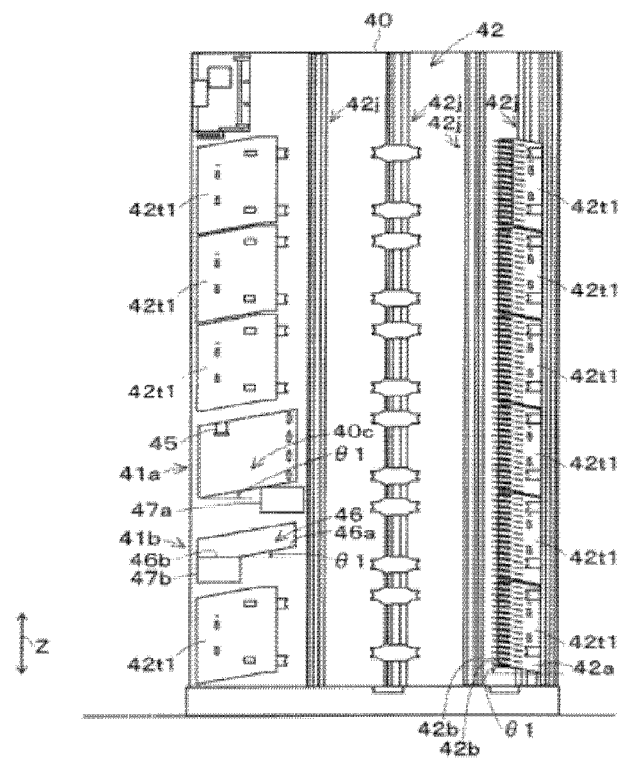
FIG. 4 is a side view when the storage of FIG. 3C is viewed in an arrow IV direction.

As long as storage 40 can store articles 21, storage 40 may have any form. As illustrated in FIGS. 3A to 3C, for example, storage 40 of the present embodiment is formed in an octagonal prism shape. It should be noted that in FIG. 3C, an upper part of storage 40 is opened, and an inside of storage 40 is illustrated. Moreover, FIG. 4 is a schematic view of the inside of storage 40 when viewed from arrow IV direction illustrated in FIG. 3C, and mainly illustrates a positional relationship among first opening section 41a, second opening section 41b, a storage unit (in FIG. 4, first storage unit 42t1), and the like.

Figure 5:
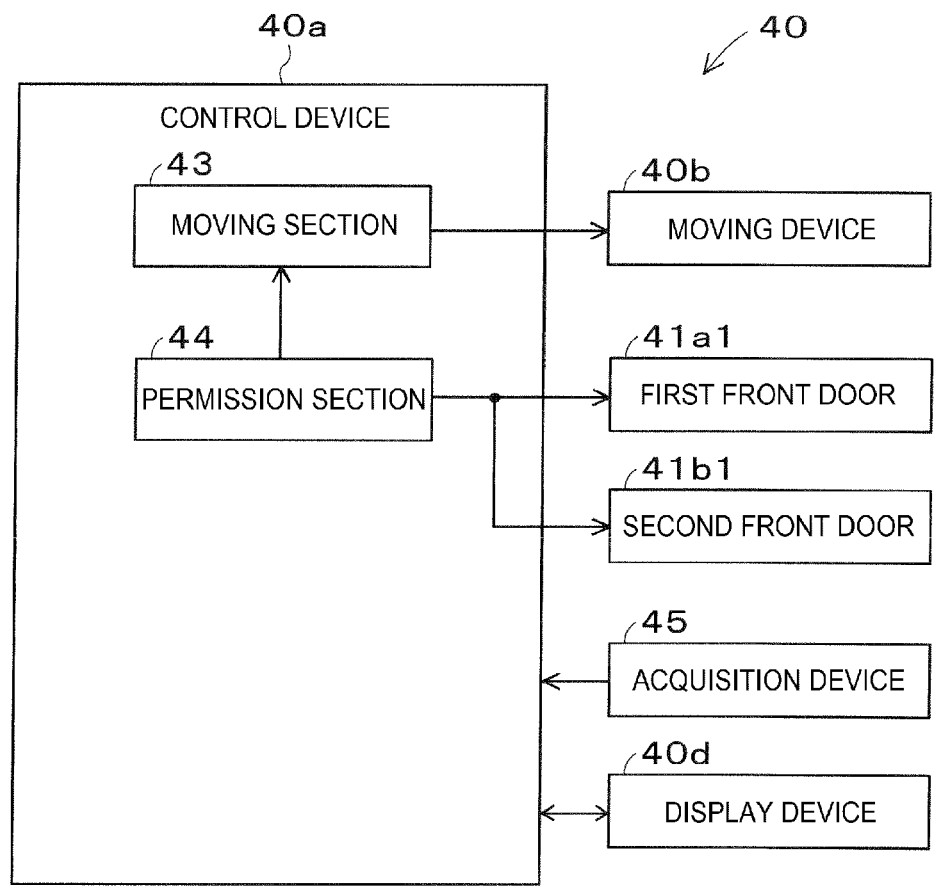
FIG. 5 is a block diagram illustrating an example of a control block of the storage.

Storage 40 includes first opening section 41a, second opening section 41b, storage section 42, control device 40a, and moving device 40b. Storage 40 may further include at least one of acquisition device 45, chute section 46, first accommodation section 47a, and second accommodation section 47b. As illustrated in FIG. 5, control device 40a includes moving section 43 when viewed as a control block. Control device 40a may further include permission section 44. In addition, storage 40 may include work space 40c and display device 40d. As illustrated in FIGS. 3A-3C, 4, and 5, storage 40 of the present embodiment includes all of the components and devices described above.

1-3-1. Schematic Configuration of Storage 40

As illustrated in FIG. 3A, first opening section 41a and second opening section 41b are provided on a front face of storage 40. Article 21 used in board working machine 10 for performing predetermined board work on board 90 is received or delivered through first opening section 41a. First opening section 41a is formed in a larger size than article 21 so that article 21 can be received or delivered. It should be noted that article 21 can be received or delivered through first opening section 41a in a state where article 21 is accommodated in accommodation case 23. In this case, first opening section 41a is formed in a larger size than that of accommodation case 23 so that accommodation case 23 can be received or delivered. The above description can be similarly applied to second opening section 41b.

In the present embodiment, acquisition device 45 is provided only in first opening section 41a. Acquisition device 45 acquires the identification information for identifying article 21 by reading identification code 22 provided on article 21. As acquisition device 45, a well-known reader (for example, a code reader that reads a one-dimensional code and a two-dimensional code, a wireless reader that performs wireless communication with a wireless tag, or the like) can be used. As illustrated in FIG. 4, acquisition device 45 is disposed above work space 40c provided in the vicinity of first opening section 41a.

Acquisition device 45 can acquire at least the identification information of the identification information and the article information by reading identification code 22 provided on article 21 when article 21 is received through first opening section 41a. It should be noted that acquisition device 45 can also acquire the specific information by reading specific code 24 provided in accommodation case 23 when accommodation case 23 accommodating article 21 is received through first opening section 41a. In this case, acquisition device 45 can acquire the identification information of article 21 accommodated in accommodation case 23 based on the correspondence between the specific information and the identification information.

Second opening section 41b is an opening section different from first opening section 41a, and when reception work or delivery work of article 21 is performed through first opening section 41a, article 21 different from article 21 can be received or delivered through second opening section 41b. As illustrated in FIG. 4, storage 40 of the present embodiment includes work space 40c in which the reception work or delivery work of article 21 is performed through first opening section 41a, and chute section 46 in which the delivery work of article 21 can be performed through second opening section 41b. As a result, in storage 40 of the present embodiment, when the reception work or the delivery work of article 21 is performed through first opening section 41a, article 21 different from article 21 can be delivered through second opening section 41b.

Chute section 46 causes article 21 carried out from storage section 42 by moving section 43 to slide toward second opening section 41b. As illustrated in FIG. 4, chute section 46 is inclined with respect to a horizontal plane. Accordingly, when article 21 is carried out to first upstream position 46a, article 21 slides through chute section 46 to second downstream position 46b. Article 21 which has slid on chute section 46 is delivered through second opening section 41b.

Inclination angle θ1 of chute section 46 may be an angle at which at least article 21 can slide, and can be set in consideration of weight, shape, frictional resistance, and the like of article 21, for example. Inclination angle θ1 of chute section 46 can also be set in consideration of inclination angle θ1 of partition section 42b of storage section 42 to be described below. In addition, chute section 46 can cause accommodation case 23 in which article 21 is accommodated to slide toward second opening section 41b.

As described above, in storage 40 of the present embodiment, acquisition device 45 is provided only in first opening section 41a. In addition, first opening section 41a is a reception/delivery opening through which article 21 can be received or delivered, and second opening section 41b is a delivery dedicated opening through which article 21 can be delivered. Therefore, acquisition device 45 is not required for second opening section 41b, and thus, second opening section 41b can be easily downsized as compared with first opening section 41a. In addition, as compared with work space 40c provided in first opening section 41a, it is easy to reduce the space of chute section 46 provided in second opening section 41b.

Storage 40 of the present embodiment includes chute section 46. Article 21 which has slid on chute section 46 is delivered through second opening section 41b. Chute section 46 does not require a moving mechanism for primarily moving article 21, and, for example, it is easy to reduce the space as compared with a case where a conveyance device such as a belt conveyor is provided instead of chute section 46. In addition, in a case where the above-described conveyance device or chute section 46 is not provided, it is necessary for moving device 40b to be described below to convey article 21 to second opening section 41b through a gap between storage sections 42. Accordingly, the control of moving device 40b may be complicated. Since storage 40 of the present embodiment includes chute section 46, as long as moving device 40b carries out article 21 to first position 46a on an upstream side of chute section 46, moving device 40b may have any configuration, and thus, the control of moving device 40b can be simplified.

As long as storage section 42 can store article 21, storage section 42 may have any form. For example, in a case where article 21 is reel 21a, as illustrated in FIG. 3C and FIG. 4, storage section 42 may include main body section 42a and partition section 42b. Main body section 42a is formed in an U shape when viewed in a vertical direction (Z-axis direction). Partition section 42b is provided so as to protrude upward at a predetermined angle with respect to main body section 42a, and can store reel 21a. An angle of partition section 42b is set so as to suppress the detachment of reel 21a.

In addition, partition section 42b of the present embodiment is provided in multiple pairs (15:30 in FIG. 4), and can accommodate multiple (15) reels 21a. Each of the multiple pairs (15 pairs) of partition sections 42b is provided with two partition sections 42b separated from each other so as not to interfere with moving device 40b. In FIGS. 3C and 4, for convenience of illustration, some members are assigned with reference symbols, and not all members are assigned with reference symbols.

As illustrated in FIG. 3B and FIG. 3C, storage section 42 of the present embodiment is disposed in a circular shape in the vertical direction (the Z-axis direction). In addition, storage section 42 of the present embodiment includes first storage unit 42t1 and second storage unit 42t2, and each of first storage unit 42t1 and second storage unit 42t2 is provided in multiple units along the vertical direction (the Z-axis direction). First storage unit 42t1 is formed wider than second storage unit 42t2, and can store large-sized reel 21a as compared with reel 21a which can be stored in second storage unit 42t2.

As illustrated in FIG. 3C and FIG. 4, first storage units 42t1 are coupled in the vertical direction (the Z-axis direction) by coupling section 42j. In addition, second storage units 42t2 are coupled in the vertical direction (the Z-axis direction) by coupling section 42j. In addition, first storage units 42t1 adjacent to each other are coupled by coupling section 42j, and second storage units 42t2 adjacent to each other are coupled by coupling section 42j. In addition, first storage unit 42t1 and second storage unit 42t2 adjacent to each other are coupled by coupling section 42j.

The type, number, and disposition of the storage units can be appropriately changed. In addition, the shape and size (width, depth, and height) of the storage unit can be set according to article 21 to be stored, and storage section 42 can store article 21 other than reel 21a. In addition, storage section 42 can store accommodation case 23 accommodating article 21. In addition, article 21 or accommodation case 23 may be stored in any suitable storage unit, and in a case where board production facility 80 includes multiple storages 40, article 21 or accommodation case 23 may be accommodated in any storage 40 as long as storage 40 includes a suitable storage unit.

Control device 40a includes a well-known computing device and a storage device, and constitutes a control circuit. Control device 40a is provided so as to be capable of communicating with moving device 40b, acquisition device 45, and display device 40d, and can control them. In addition, control device 40a can store article information on article 21, and can also notify management device 19 of the article information. For example, in a case where article 21 is reel 21a, the article information may include a component type, the number of components (remaining number), a reel diameter, a type, a supplier (vendor), an expiration date, and the like in the component accommodated in reel 21a.

Moving device 40b moves article 21 to predetermined storage section 42 when article 21 is received through first opening section 41a or second opening section 41b, and moves article 21 stored in storage section 42 to first opening section 41a or second opening section 41b when article 21 is delivered. Moving device 40b of the present embodiment moves article 21 from work space 40c provided in first opening section 41a to predetermined storage section 42 when article 21 is received through first opening section 41a. Moving device 40b moves article 21 stored in storage section 42 to chute section 46 provided in second opening section 41b when article 21 is delivered. It should be noted that moving device 40b can move article 21 stored in storage section 42 to work space 40c provided in first opening section 41a when article 21 is delivered.

As illustrated in FIG. 3B, moving device 40b of the present embodiment is provided inside storage unit (first storage units 42t1 and second storage units 42t2) when viewed in the vertical direction (the Z-axis direction). As long as moving device 40b can move article 21, and moving device 40b may have any form. For example, a robot arm (an articulated robot), a lifting and lowering slide mechanism, and the like can be used for moving device 40b. For example, in a case where article 21 is reel 21a, as illustrated in FIG. 3C, moving device 40b may include lifting and lowering section 40b1 and gripping section 40b2.

Raising/lowering section 40b1 can rotate around an axial line along the vertical direction (Z-axis direction), and can lift or lower gripping section 40b2 along the vertical direction (Z-axis direction). Gripping section 40b2 can move forward or rearward at the same angle as inclination angle θ1 of work space 40c illustrated in FIG. 4. In addition, gripping section 40b2 can move forward or rearward at the same angle as inclination angle θ1 of partition section 42b of storage section 42. In addition, gripping section 40b2 can move forward or rearward at the same angle as inclination angle θ1 of chute section 46.

As described above, in storage 40 of the present embodiment, inclination angle θ1 of work space 40c provided in first opening section 41a coincides with inclination angle θ1 of partition section 42b of storage section 42. Accordingly, storage 40 of the present embodiment can perform an unloading operation at the time of reception when reel 21a is unloaded from work space 40c and a storage operation at the time of reception when unloaded reel 21a is stored in storage section 42 by lifting and lowering operations, a rotation operation, a forward movement operation, and a rearward movement operation of moving device 40b.

In storage 40 of the present embodiment, inclination angle θ1 of chute section 46 coincides with inclination angle θ1 of partition section 42b of storage section 42. Accordingly, storage 40 of the present embodiment can perform an unloading operation at the time of delivery when reel 21a is unloaded from the storage unit and a sending operation at the time of deliver at when unloaded reel 21a is sent out to chute section 46 by the lifting and lowering operations, the rotating operation, the forward movement operation, and the rearward movement operation of the moving device 40b.

As illustrated in FIG. 3A, storage 40 includes display device 40d. Display device 40d can use a well-known display device, and displays various data so as to be visually recognizable by the operator. For example, display device 40d displays the article information on article 21 stored in storage section 42 in accordance with an operation of the operator. It should be noted that display device 40d of the present embodiment is configured by a touch panel, and display device 40d also serves as an input device for receiving various operations by the operator.

For example, the operator can designate desired article 21 to be delivered from storage 40 using a touch panel (display device 40d functioning as an input device). In this case, control device 40a uses moving device 40b to move and deliver designated article 21 to work space 40c provided in first opening section 41a or chute section 46 provided in second opening section 41b.

In addition, control device 40a can store positional information, reception/delivery information, and storage information of article 21 in storage section 42. The positional information indicates a storage location of article 21. The reception/delivery information indicates the date and time of receipt and date and time of delivery of article 21. For example, the storage information includes information such as an ambient temperature of storage section 42, a humidity of storage section 42, and the like. Control device 40a stores the positional information and the reception date and time of article 21 when article 21 is stored. Control device 40a stores storage information during storage of article 21. Control device 40a stores the delivery date and time of article 21 when article 21 is delivered.

1-3-2. Example of Control of Reception and Delivery of Article 21

Figure 6A:
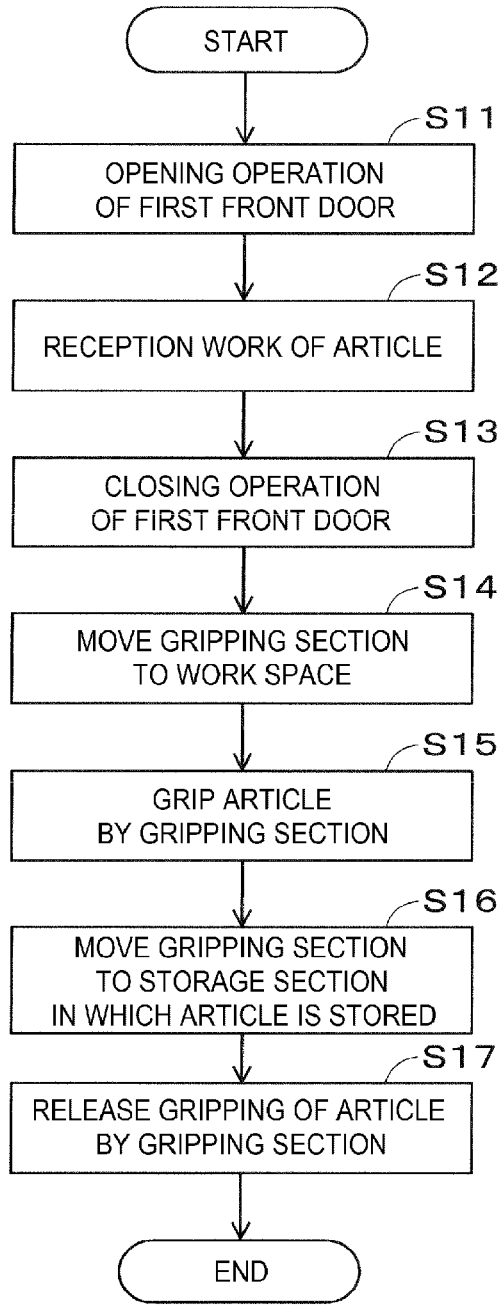
FIG. 6A is a flowchart illustrating an example of a control procedure in reception work of an article.
Figure 6B:
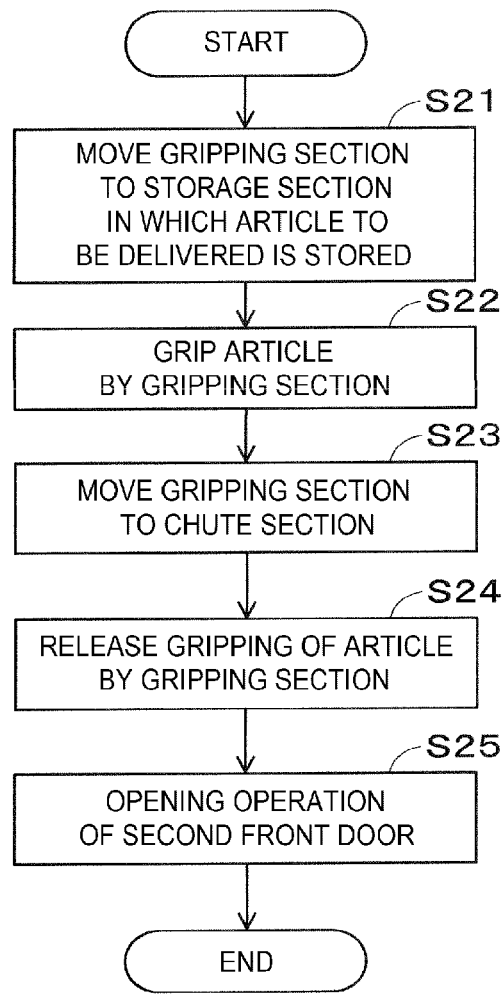
FIG. 6B is a flowchart illustrating an example of a control procedure in delivery work of an article.

As illustrated in FIG. 5, control device 40a includes moving section 43 and permission section 44 when viewed as control blocks. Control device 40a executes a control program according to flowcharts illustrated in FIGS. 6A and 6B. FIG. 6A illustrates an example of a control procedure in the reception work of article 21, and FIG. 6B illustrates an example of a control procedure in the delivery work of article 21.

Moving section 43 moves article 21 to predetermined storage section 42 when article 21 is received through first opening section 41a or second opening section 41b, and moves article 21 stored in storage section 42 to first opening section 41a or second opening section 41b when article 21 is delivered. Moving section 43 of the present embodiment moves article 21 to predetermined storage section 42 when article 21 is received through first opening section 41a, and moves article 21 stored in storage section 42 to second opening section 41b when article 21 is delivered. Moving section 43 can move article 21 by driving and controlling above-described moving device 40b.

Permission section 44 permits the operator to perform the reception work of article 21 through first opening section 41a. In a mode in which storage 40 includes permission section 44, moving section 43 performs the delivery work of article 21 different from article 21 through second opening section 41b in parallel with the reception work by the operator through first opening section 41a when the reception work of article 21 by the operator is permitted by permission section 44.

Specifically, permission section 44 prohibits the operator from performing the reception work of article 21 through first opening section 41a, for example, when moving device 40b is performing or is scheduled to perform the work in work space 40c. Conversely, permission section 44 permits the operator to perform the reception work of article 21 through first opening section 41a when moving device 40b is not performing the work in work space 40c and is not scheduled to perform the work.

First front door 41a1 illustrated in FIG. 5 is provided between first opening section 41a and work space 40c. When the reception work of article 21 by the operator through first opening section 41a is prohibited by permission section 44, first front door 41a1 is closed, and thus, interference between the operator and moving device 40b is suppressed. Second front door 41b 1 illustrated in FIG. 5 is provided between second opening section 41b and chute section 46. Second front door 41b1 can be opened when article 21 can be delivered from second opening section 41b.

The operator designates desired article 21 to be delivered from storage 40 using a touch panel (display device 40d functioning as an input device). In the present embodiment, the operator designates reel 21a that is article 21. In addition, the operator uses the touch panel to instruct the opening operation of first front door 41a1. Control device 40a performs the opening operation of first front door 41a1 when the reception work of article 21 by the operator is permitted by permission section 44 (Step S11 illustrated in FIG. 6A).

The operator receives article 21 at a predetermined position in work space 40c through first opening section 41a (Step S12). When the reception work of article 21 is completed, the operator uses the touch panel to instruct the closing operation of first front door 41a1. As a result, control device 40a performs the closing operation of first front door 41a1 (Step S13). The work from the time when the operator instructs the opening operation of first front door 41a1 to the time when the operator instructs the closing operation of first front door 41a1 corresponds to the reception work of article 21 by the operator through first opening section 41a (Steps S11 to S13).

When the reception work of article 21 described above is performed, moving section 43 performs the delivery work of article 21 different from article 21 through second opening section 41b in parallel with the reception work by the operator through first opening section 41a (Steps S21 to S25 illustrated in FIG. 6B). First, moving section 43 moves gripping section 40b2 to storage section 42 in which article 21 to be delivered is stored (Step S21). Specifically, lifting and lowering section 40b1 rotates as necessary to lift or lower gripping section 40b2 along the vertical direction (the Z-axis direction) so that gripping section 40b2 reaches reel 21a stored at a desired storage location (pair of partition sections 42b) when gripping section 40b2 moves forward.

Next, gripping section 40b2 moves forward to grip reel 21a stored in the storage location (the pair of partition sections 42b), and moves rearward in a state where reel 21a is gripped (Step S22). After the unloading operation at the time of delivery described above, moving section 43 moves gripping section 40b2 to chute section 46 (Step S23). Specifically, lifting and lowering section 40b1 rotates as required to lift or lower gripping section 40b2 along the vertical direction (the Z-axis direction) so that reel 21a gripped by gripping section 40b2 reaches first position 46a of chute section 46 when gripping section 40b2 moves forward.

Next, gripping section 40b2 moves forward to move reel 21a to first position 46a of chute section 46, the gripping of reel 21a is released, and gripping section 40b2 moves rearward (Step S24). As a result of the above-described sending operation at the time of delivery, reel 21a, which is article 21, slides along chute section 46 and reaches second opening section 41b. When article 21 can be delivered from second opening section 41b, control device 40a guides the fact that article 21 can be delivered using the touch panel, and the opening operation of second front door 41b1 is enabled (Step S25).

When article 21 can be delivered from the second opening section 41b and the closing operation of first front door 41a1 is completed (processes illustrated in Steps S13 and S25 are completed), moving section 43 moves gripping section 40b2 to work space 40c (Step S14). Specifically, lifting and lowering section 40b1 lifts or lowers gripping section 40b2 along the vertical direction (the Z-axis direction) so that gripping section 40b2 reaches reel 21a received in work space 40c when gripping section 40b2 moves forward. Next, gripping section 40b2 moves forward to grip reel 21a, and moves rearward in a state where reel 21a is gripped (Step S15).

After the above-described unloading operation at the time of reception, moving section 43 moves gripping section 40b2 to storage section 42 in which article 21 is stored (Step S16). Specifically, lifting and lowering section 40b1 rotates as necessary to lift or lower gripping section 40b2 along the vertical direction (the Z-axis direction) so that gripping section 40b2 reaches a predetermined storage location (pair of partition sections 42b of first storage unit 42t1 or second storage unit 42t2) when gripping section 40b2 moves forward. Next, gripping section 40b2 moves forward to insert reel 21a into the storage location (pair of partition sections 42b), the gripping of reel 21a is released, gripping section 40b2 moves rearward (Step S17) As a result of the storage operation at the time of reception described above, reel 21a which is article 21 is stored in storage section 42.

As described above, in the present embodiment, when the reception work of article 21 by the operator is permitted by permission section 44, moving section 43 performs the delivery work of article 21 different from article 21 through second opening section 41b in parallel with the reception work by the operator through first opening section 41a. Accordingly, in storage 40, it is possible to shorten a time required for the reception work and the delivery work of article 21 as compared with, for example, a case where the delivery work of article 21 different from article 21 is performed after the reception work by the operator through first opening section 41a is completed.

Figure 7:
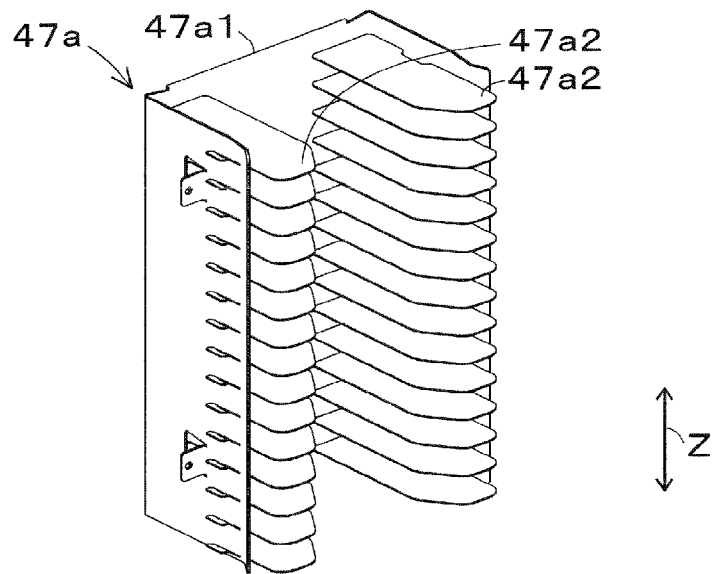
FIG. 7 is a perspective view illustrating an example of a first accommodation section.

As illustrated in FIG. 4, storage 40 of the present embodiment includes first accommodation section 47a capable of temporarily accommodating multiple articles 21 to be received through first opening section 41a. As long as first accommodation section 47a temporarily can accommodate multiple articles 21, first accommodation section 47a may have any form. FIG. 7 illustrates an example of first accommodation section 47a. Similar to storage section 42, first accommodation section 47a includes main body section 47a1, and partition sections 47a2 which are provided so as to protrude upward at a predetermined angle with respect to main body section 47a1 to accommodate reel 21a.

Partition section 47a2 of the present embodiment is provided in multiple pairs (15:30 in FIG. 7), and can accommodate multiple (15) reels 21a. Each of the multiple pairs (15 pairs) of partition sections 47a2 is provided with two partition sections 47a2 separated from each other so as not to interfere with moving device 40b. In FIG. 7, for convenience of illustration, some members are assigned with reference symbols, and not all members are assigned with reference symbols. In addition, it is preferable that inclination angle θ1 of partition section 47a2 of first accommodation section 47a coincides with inclination angle θ1 of partition section 42b of storage section 42. As a result, storage 40 can obtain the same effect as the case where inclination angle θ1 of chute section 46 coincides with inclination angle θ1 of partition section 42b of storage section 42.

In a mode in which storage 40 includes first accommodation section 47a, moving section 43 can deliver article 21 that need to be delivered through second opening section 41b when it is necessary to deliver article 21 stored in storage section 42 during the reception work of multiple articles 21 through first opening section 41a. Specifically, moving section 43 temporarily accommodates multiple articles 21 to be received through first opening section 41a in first accommodation section 47a, so that, for example, articles 21 accommodated in first accommodation section 47a can be stored in storage section 42 using, for example, an idling time of storage 40.

In addition, when it is necessary to deliver article 21 stored in storage section 42 during the reception work of multiple articles 21 through first opening section 41a, moving section 43 delivers article 21 that needs to be delivered through second opening section 41b. At this time, moving section 43 can perform the reception work of article 21 by the operator through first opening section 41a and the delivery work of article 21 through second opening section 41b in parallel with each other in the same manner as described above.

In addition, when it is necessary to deliver article 21 stored in storage section 42 during the reception work of multiple articles 21 through first opening section 41a, moving section 43 may preferentially perform the delivery work of article 21 requiring the delivery with respect to the reception work of article 21 through first opening section 41a. For example, moving section 43 can perform the delivery work of multiple articles 21 through second opening section 41b while the reception work of one article 21 is performed through first opening section 41a. In addition, when it is necessary to deliver article 21 stored in storage section 42, moving section 43 can stop the reception work of article 21, and can perform the delivery work of article 21 using both or one of first opening section 41a and second opening section 41b. In any of the above cases, moving section 43 can move article 21 by driving and controlling above-described moving device 40b.

As illustrated in FIG. 4, storage 40 of the present embodiment includes second accommodation section 47b capable of temporarily accommodating multiple articles 21 to be delivered through second opening section 41b. As long as second accommodation section 47b can temporarily accommodate multiple articles 21, second accommodation section 47b may have any form. For example, a tray can be used as second accommodation section 47b. The tray can sequentially stack articles 21 moved to second opening section 41b.

In a mode in which storage 40 includes second accommodation section 47b, moving section 43 can move multiple articles 21 required for board working machine 10 to second accommodation section 47b based on a production plan of a board product, and can deliver multiple articles 21 accommodated in second accommodation section 47b through second opening section 41b. For example, the production plan of the board product is stored in management device 19. Based on the production plan of the board product, management device 19 indicates article 21 (multiple articles 21 for which board working machine 10 is required) to be delivered to storage 40. Moving section 43 drives and controls above-described moving device 40b to move indicated article 21. As a result, storage 40 can collectively deliver multiple articles 21 required in the production plan.

1-4. Other

In the above embodiment, article 21 is mainly described as an example of reel 21a. However, for example, article 21 may be feeder 21b, tray 21c, solder container 21d, the holding member, the holding member accommodation device described above, or the like. Storage 40 can include a storage unit conforming to article 21, and can include a moving device confirming to article 21. In addition, moving device of storage 40 can store accommodation case 23 in which article 21 is accommodated in the storage unit for each accommodation case 23.

Storage 40 can also deliver article 21 different from article 21 through second opening section 41b when the delivery work of article 21 is performed through first opening section 41a. Specifically, when gripping section 40b2 carries out reel 21a to be delivered through first opening section 41a to work space 40c, the rear door provided between work space 40c and moving device 40b is closed. Then, control device 40a performs the opening operation of first front door 41a1, and thus, the operator can perform the delivery work of reel 21a through first opening section 41a.

When reel 21a to be delivered through first opening section 41a is carried out to work space 40c, gripping section 40b2 moves to storage section 42 in order to acquire reel 21a to be delivered through second opening section 41b. Then, gripping section 40b2 acquires reel 21a delivered through second opening section 41b from storage section 42, and carries out reel 21a to first position 46a of chute section 46. Carried-out reel 21a slides along chute section 46 and reaches second opening section 41b.

As described above, storage 40 can perform the delivery work of article 21 by the operator through first opening section 41a and the delivery work of article 21 different from article 21 through second opening section 41b in parallel with each other. In this case, permission section 44 permits the delivery work of article 21 by the operator through first opening section 41a. When the delivery work of article 21 by the operator is permitted by permission section 44, moving section 43 performs the delivery work of article 21 different from article 21 through second opening section 41b in parallel with the delivery work by the operator through first opening section 41a.

In addition, storage 40 can receive article 21 different from article 21 through second opening section 41b when the reception work or delivery work of article 21 is performed through first opening section 41a. In this case, storage 40 can include a second chute section instead of chute section 46. The second chute section causes article 21 received through second opening section 41b to slide toward a predetermined position. The predetermined position can be set to a position at which gripping section 40b2 can grip article 21 which has slid on the second chute section. It should be noted that in a case where the positioning of article 21 which has slid on the second chute section is difficult, storage 40 may include a positioning device for positioning article 21 at a predetermined position. In addition, storage 40 may include a conveyance device which conveys article 21 received through second opening section 41b to a predetermined position instead of the second chute section.

In addition, when article 21 is received through second opening section 41b, it is necessary to provide acquisition device 45 in second opening section 41b. For example, in a case where it is difficult to provide acquisition device 45 in second opening section 41b due to convenience of the installation space or the like, for example, a wireless tag or the like may be used as identification code 22. A wireless reader (acquisition device 45) for performing wireless communication with a wireless tag may be provided at a position separated from second opening section 41b.

2. Example of Effects of Embodiment

According to storage 40, first opening section 41a, second opening section 41b, and moving section 43 are provided. As a result, storage 40 can perform the reception work or the delivery work of article 21 through first opening section 41a and the reception work or the delivery work of article 21 different from article 21 through second opening section 41b in parallel with each other, and thus, the work efficiency of the reception work or the delivery work of article 21 is improved.

REFERENCE SIGNS LIST

10: board working machine, 10c: component mounter, 21: article, 21a: reel, 22: identification code, 40: storage, 41a: first opening section, 41b: second opening section, 42: storage section, 42a: main body section, 42b: partition section, 43: moving section, 44: permission section, 45: acquisition device, 46: chute section, 47a: first accommodation section, 47b: second accommodation section, 90: board, θ1: inclination angle

The invention claimed is:

1. A storage comprising:
a first opening section through which an article used in board working machine configured to perform predetermined board work on a board is received or delivered, the first opening section being disposed on a front face of the storage, and the first opening section being a reception/delivery opening through which the article is received or delivered;
a second opening section which is different from the first opening section and through which an article different from the article is delivered when reception work or delivery work of the article is performed through the first opening section, the second opening section being disposed below the first opening section on the front face of the storage, the second opening section being smaller than the first opening section, and the second opening section being a delivery dedicated opening through which the article is delivered;
a moving section configured to move the article to a predetermined storage section when the article is received through the first opening section or the second opening section and move the article stored in the storage section to the first opening section or the second opening section when the article is delivered;
an acquisition device configured to read an identification code provided in the article to acquire identification information for identifying the article is provided only in the first opening section;
a work space in which the reception work or the delivery work of the article is performed through the first opening section;
a chute section along which the article carried out from the storage section slides toward the second opening section by the moving section;
a first front door provided between the first opening section and the work space;
a second front door provided between the second opening section and the chute section; and a control device configured to prohibit an operator from performing the reception work of the article through the first opening section when the moving device is performing or is scheduled to perform the work in work space, and configured to permit the operator to perform the reception work of the article through first opening section when the moving device is not performing the work in work space and is not scheduled to perform the work, wherein the first front door is closed when the control device prohibits the operator from performing the reception work of the article through the first opening section, and the second front door may be opened when the article is delivered from the second opening section.

2. The storage according to claim 1, further comprising:

a permission section configured to permit the reception work of the article by an operator through the first opening section, wherein the moving section performs the delivery work of the article different from the article through the second opening section in parallel with the reception work by the operator through the first opening section when the reception work of the article by the operator is permitted by the permission section.

3. The storage according to claim 1, wherein the board working machine is a component mounter configured to mount a component on the board, the article is a reel around which a component tape configured to accommodate the component is wound, the storage section includes a main body section and a partition section provided so as to project upward at a predetermined angle with respect to the main body section to store the reel, and an inclination angle of the chute section coincides with an inclination angle of the partition section of the storage section.

4. The storage according to claim 1, further comprising:

a first accommodation section configured to temporarily accommodate multiple articles to be received through the first opening section.

5. The storage according to claim 4, wherein the moving section delivers article that needs to be delivered through second opening section when it is necessary to deliver the article stored in the storage section during the reception work of the multiple articles through the first opening section.

6. The storage according to claim 1, further comprising:

a second accommodation section configured to temporarily accommodate multiple articles to be delivered through the second opening section.

7. The storage according to claim 6, wherein the moving section moves the multiple articles required for the board working machine to the second accommodation section based on a production plan of a board product and delivers the multiple articles accommodated in the second accommodation section through second opening section.

* * * * *